(12) United States Patent
Iizuka et al.

(10) Patent No.: US 7,022,575 B2
(45) Date of Patent: Apr. 4, 2006

(54) MANUFACTURING METHOD OF SEMICONDUCTOR DEVICE

(75) Inventors: Katsuhiko Iizuka, Gunma (JP); Kazuo Okada, Ota (JP); Tomonori Mori, Gunma (JP); Hiroyuki Dobashi, Gunma (JP); Hiroyuki Suzuki, Gunma (JP); Takayoshi Honda, Gunma (JP); Toshimitsu Taniguchi, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/974,970

(22) Filed: Oct. 28, 2004

(65) Prior Publication Data
US 2005/0136629 A1    Jun. 23, 2005

(30) Foreign Application Priority Data
Oct. 29, 2003  (JP) .............................. 2003-369269

(51) Int. Cl.
H01L 21/336  (2006.01)
H01L 21/8234  (2006.01)
H01L 21/28  (2006.01)
H01L 21/44  (2006.01)

(52) U.S. Cl. .................. 438/303; 438/275; 438/581
(58) Field of Classification Search ................ 438/581, 438/303, 304, 305, 275, 306, 307
See application file for complete search history.

(56) References Cited

U.S. PATENT DOCUMENTS 5,776,822 A * 7/1998 Fujii et al. .................. 438/586
5,783,479 A * 7/1998 Lin et al. .................... 438/592
5,960,319 A * 9/1999 Iwata et al. ................. 438/664
6,498,067 B1 * 12/2002 Perng et al. ................. 438/305
6,509,609 B1 * 1/2003 Zhang et al. ................ 257/330
6,537,884 B1 * 3/2003 Yogo et al. .................. 438/286
6,630,716 B1 * 10/2003 Juengling .................... 257/369
6,632,714 B1 * 10/2003 Yoshikawa .................. 438/258
6,911,695 B1 * 6/2005 Ahmed et al. .............. 257/336
6,949,429 B1 * 9/2005 Kim et al. ................... 438/253
2004/0043594 A1 * 3/2004 Kammler et al. ........... 438/592

FOREIGN PATENT DOCUMENTS

| JP | 11-186545 | 7/1999 |
| JP | 2000-100754 | 4/2000 |
| JP | 2002-025941 | 1/2002 |
| JP | 2002-134704 | 5/2002 |

* cited by examiner

Primary Examiner—Chuong Anh Luu
(74) Attorney, Agent, or Firm—Morrison & Foerster LLP

(57) ABSTRACT

An LDD structure and a silicide layer are formed without a reduction in thickness of a silicon substrate or a carbon contamination. Forming a spacer on a sidewall of a gate electrode is performed in two process steps, i.e. dry-etching and wet-etching. Also, a silicon nitride film used as a buffer film in injection of high dose of impurities is removed by wet-etching. As a result, the reduction in thickness of the silicon substrate and the carbon contamination can be prevented. In addition, variation in depth of the high and low impurity concentration regions and silicide forming region with locations on the wafer can be suppressed because of high selection ratio available with the wet-etching.

10 Claims, 9 Drawing Sheets

MANUFACTURING METHOD OF SEMICONDUCTOR DEVICE

CROSS-REFERENCE OF THE INVENTION

This invention is based on Japanese Patent Application No. 2003-369269, the content of which is incorporated herein by reference in its entirety.

BACKGROUND OF THE INVENTION

1. Field of the Invention

This invention relates to a manufacturing method of a semiconductor device, specifically to a manufacturing method of a semiconductor device having an LDD (Lightly Doped Drain) structure and silicide layers formed on a silicon substrate and a gate electrode.

2. Description of the Related Art

As a manufacturing process of a semiconductor device moves to a finer design rules, there arises a problem that characteristics of a MOS transistor decline due to a short channel effect. A technology called LDD has been developed and used as a countermeasure against the problem. Another problem is resistance increase of a gate electrode and source and drain regions due to reduced dimensions of the gate electrode and the source and drain regions. A technology called salicide is used as a countermeasure against the problem. Silicide layers are formed in a self-aligned manner around surfaces of the gate electrode and the source and drain regions by a reaction between transition metal and silicon in the salicide technology. Many of semiconductor devices in recent years have been manufactured by a combination of these two technologies.

A manufacturing process of the semiconductor device using the combination of the LDD structure and the salicide technology will be briefly described hereafter, referring to FIGS. 9–14.

A gate insulation film 12 is formed on a silicon substrate 11, as shown in FIG. 9. A silicon oxide film is generally used as the gate insulation film 12. A film of a material to make a -gate electrode 13 is formed on the gate insulation film 12. The gate electrode 13 is formed through subsequent photolithography and etching. After that, low impurity concentration regions 14 are formed by injecting a low dose of impurities into a surface of the silicon substrate 11, using the gate electrode 13 as a mask.

An insulation film is formed over the silicon substrate 11, as shown in FIG. 10. This insulation film is hereafter referred to as a spacer insulation film 15.

A spacer 16 is formed on each sidewall of the gate electrode 13 by dry-etching the spacer insulation film 15 and the gate insulation film 12 anisotropically, as shown in FIG. 11.

A buffer film 17 made of an insulation film is formed over the silicon substrate 11, as shown in FIG. 12. A high dose of impurities is injected into the silicon substrate to form high impurity concentration regions 18. After forming the high impurity concentration regions 18, the buffer film 17 is removed by dry-etching.

A transition metal film 19 is formed over the entire surface of the silicon substrate 11, as shown in FIG. 13. Heating the silicon substrate 11 causes a reaction between the transition metal film 19 and silicon, which is a material of the silicon substrate 11 and the gate electrode 13, to form silicide made from the transition metal and silicon. After removing a portion of the transition metal film 19 which has not reacted with silicon, the silicon substrate 11 is heated again to form silicide layers 20 on the surface of the silicon substrate 11 and on a surface of the gate electrode 13, as shown in FIG. 14.

Although not shown in the figure, the rest of the manufacturing process to complete the semiconductor device including forming an interlayer insulation film, opening contact holes in the high impurity concentration regions and forming metal wirings is well known in the art.

There arise following problems when a semiconductor device is manufactured by the above-mentioned technologies to form the LDD structure and the silicide layer.

First, in etching the insulation film to make the spacer 16 and the buffer film 17, usually a gas including carbon such as $CF_4$ or $CHF_3$ is used. This results in residual carbon left on the surface of the silicon substrate 11 and the surface of the gate electrode 13, more specifically in regions about 4 nm deep from the surface. The residual carbon is referred to as a carbon contamination hereafter.

Second, over-etching which takes place in forming the spacer 16 and in removing the buffer film 17 inevitably removes a surface portion of the silicon substrate, as shown in elliptical regions a in FIG. 11 and in elliptical regions b in FIG. 12. As a result, thicknesses of the low impurity concentration regions 14 and the silicide layers 20 to be formed later are reduced.

One time of the over-etching removes about 7–15 nm of the surface portion of the silicon substrate 11, thus two times of the over-etching removes about 14–30 nm of the surface portion of the silicon substrate 11.

Third, the reaction between the transition metal and silicon is hampered in regions where the carbon contamination has taken place, thus the silicide layer may not be formed in elliptical regions c in FIG. 14, leaving non-reacted portions of the transition metal there. Countermeasures against this problem such as plasma treatment on the carbon-contaminated regions and etching to remove the carbon-contaminated regions are described in the aforementioned patents.

Up to 34 nm of the surface portion of the silicon substrate is removed by the over-etching and removing the carbon-contaminated regions as described above. Reducing the thickness by about 34 nm does not cause a major problem when an ordinary silicon substrate is used, since the whole substrate is made of thick silicon.

However, it causes a big problem with a wafer having a thin substrate 11 of crystalline silicon grown on an insulator 21 as in the case of SOI (Silicon On Insulator) which has been brought into use in recent years, as shown in FIG. 15. Since the silicon substrate 11 on the insulator 21 is as thin as about 50–100 nm, removing the surface portion of the silicon substrate 11 by about 34 nm means a substantial reduction in the thicknesses of the high and low impurity concentration regions and the silicide layers. This results in a decline in characteristics of a transistor in the semiconductor device. The transistor does not operate in some cases, because the high and low impurity concentration regions and the silicide layers are not thick enough for the transistor to operate.

There is another problem that resistances of the source and drain regions and the gate electrode vary with locations on the wafer, since an etch rate and a selection ratio of the dry-etching vary with the locations on the wafer.

SUMMARY OF THE INVENTION

This invention offers an improved method of manufacturing a semiconductor device in view of the problems described above. Dry etching and wet etching are used in etching an insulation film to form a spacer. A silicon nitride film is used as a buffer film when injecting a high dose of impurities and is removed by wet etching after the injection. Substantially larger selection ratio is made available in wet etching by choosing appropriate chemical solution than a selection ratio available in dry etching. Therefore, virtually no reduction in thickness of a silicon substrate is caused in the wet-etching while the dry-etching causes the reduction in thickness of the silicon substrate due to over-etching. Also, a carbon contamination is prevented from occurring since chemical solution containing carbon is not used in the wet-etching.

DETAILED DESCRIPTION OF THE INVENTION

A method of manufacturing a semiconductor device according to an embodiment of this invention will be described hereafter, referring to FIGS. 1–8.

Figure 1:
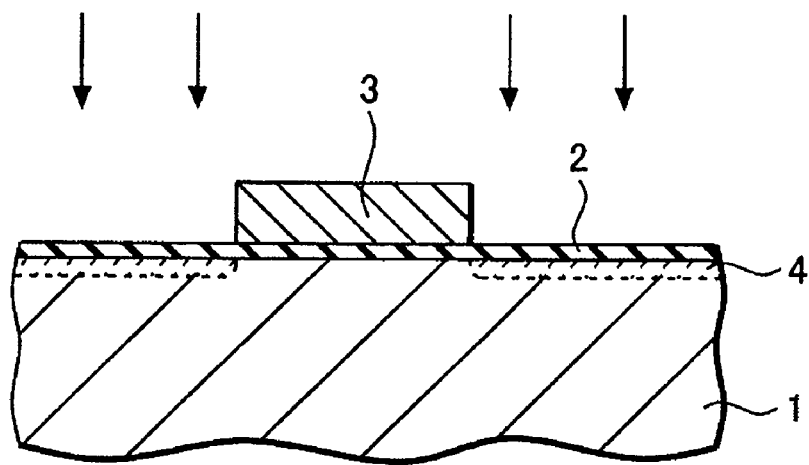
FIG. 1 is a cross-sectional view showing a manufacturing method of a semiconductor device according an embodiment of this invention.

A silicon oxide film of about 5 nm in thickness is formed on a silicon substrate 1 by thermal oxidation, as shown in FIG. 1. It becomes a gate insulation film 2. A polysilicon film of about 200 nm in thickness is formed on the gate insulation film 2. A gate electrode 3 is formed by shaping the polysilicon film by photolithography and etching.

Although not shown in the figure, it should be noted that a silicon oxide film or the like may be formed on the polysilicon film and used as a hard mask to enable higher precision etching.

After that, low impurity concentration regions 4 are formed by injecting a dose of $1–5\times10^{14}$ (ions/cm$^2$) of impurity ions, e.g. phosphorus ions, into regions 10–20 mn deep from a surface of the silicon substrate 1, using the gate electrode 3 as a mask. After the injection, $N_2$ annealing, i.e. heating the silicon substrate 1 in a flow of $N_2$ (nitrogen) gas, is performed to diffuse the impurities into the silicon substrate 1.

Figure 2:
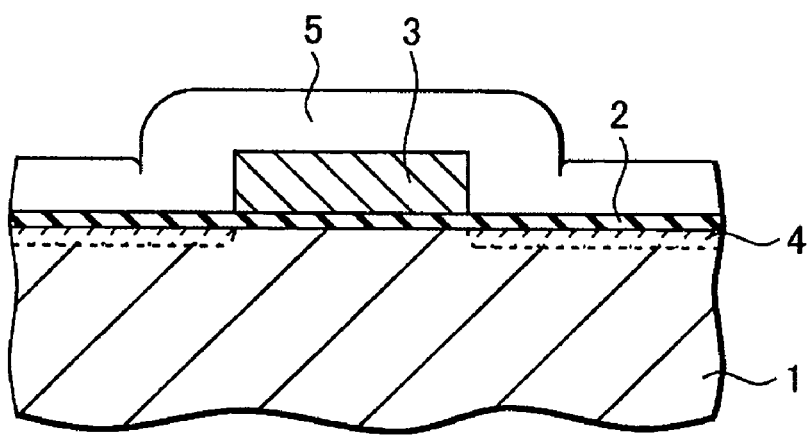
FIG. 2 is a cross-sectional view showing the manufacturing method of the semiconductor device according the embodiment of this invention.

A film made of about 120 nm thick silicon oxide such as HTO (High Temperature Oxide), TEOS (Tetra Ethyl Ortho Silicate) or NSG (Non-doped Silicate Glass) is formed over the entire surface of the silicon substrate 1, as shown in FIG. 2. This film is hereafter referred to as a spacer insulation film 5.

Subsequent $N_2$ annealing on the spacer insulation film 5 at 400–900° C. reduces difference in etch rate in wet-etching between the spacer insulation film 5 and the gate insulation film 2 which is a thermal oxidation film.

Figure 3:
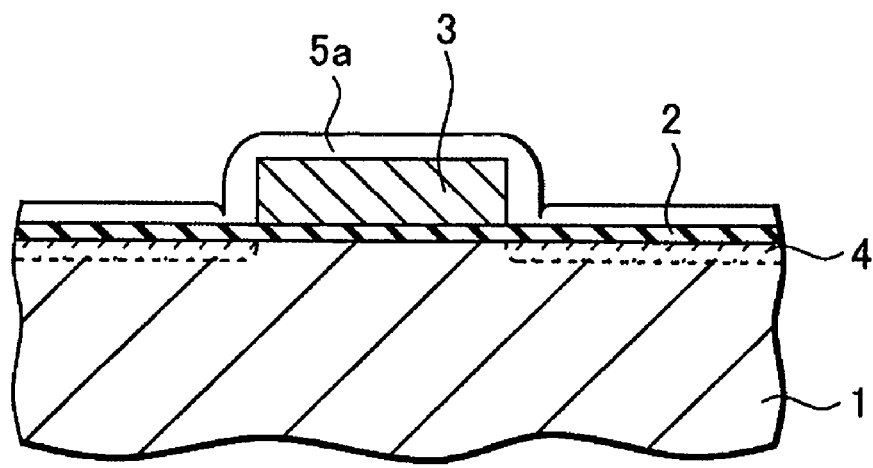
FIG. 3 is a cross-sectional view showing the manufacturing method of the semiconductor device according the embodiment of this invention.

The spacer insulation film 5 is dry-etched, as shown in FIG. 3. The dry-etching is performed to leave a remaining spacer insulation film 5a, thickness of which is 5–35% of the as-grown thickness of the spacer insulation film 5 on flat portions of the gate electrode 3 and the gate insulation film 2. The remaining spacer insulation film 5a keeps a thickness of about 5–45 nm in the embodiment.

The $N_2$ annealing at 400–900° C. mentioned above may be performed after the dry-etching. Either way, the difference in etch rate in wet-etching between the spacer insulation film 5 and the gate insulation film 2 is reduced.

Figure 4:
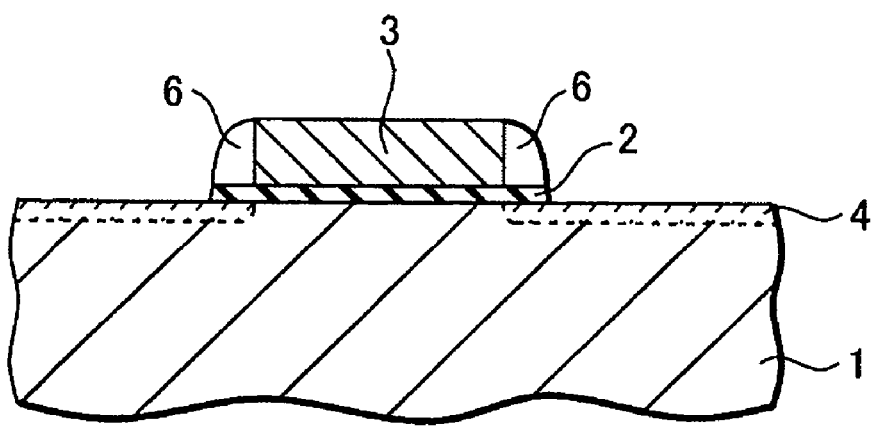
FIG. 4 is a cross-sectional view showing the manufacturing method of the semiconductor device according the embodiment of this invention.

The remaining spacer insulation film 5a and the gate insulation film 2 are wet-etched using a chemical solution primarily made of hydrofluoric acid or buffered hydrofluoric acid, as shown in FIG. 4. The chemical solution may be made of hydrofluoric acid only, or hydrofluoric acid mixed with water or surface-active agent in order to adjust an etch rate or to improve surface wettability. A spacer 6 is formed on each sidewall of the gate electrode 3 as a result.

The silicon substrate 1 and the gate electrode 3 made of polysilicon are scarcely removed in the wet-etching, since the chemical solution used in the wet-etching is primarily made of hydrofluoric acid or buffered hydrofluoric acid. Also no carbon contamination is caused in the wet-etching, because the chemical solution contains no carbon.

Figure 5:
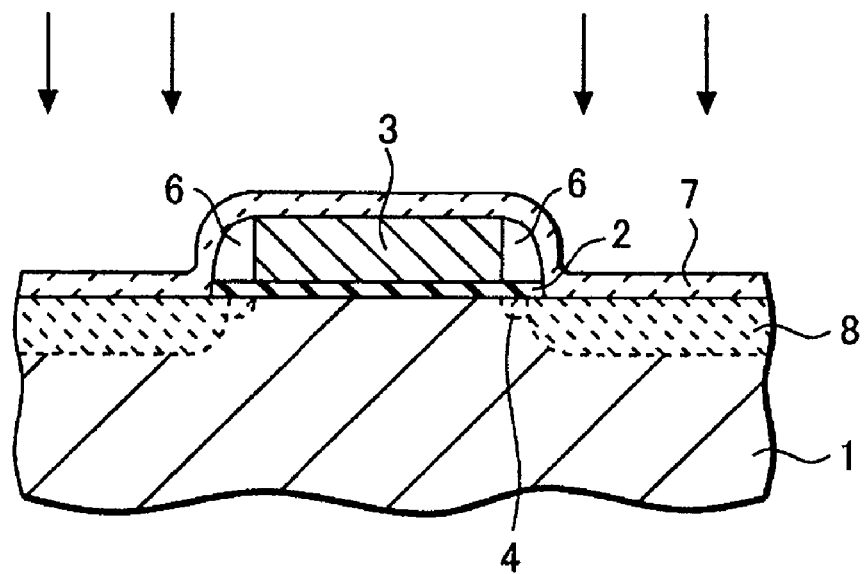
FIG. 5 is a cross-sectional view showing the manufacturing method of the semiconductor device according the embodiment of this invention.

A buffer film 7 made of an about 10 nm thick silicon nitride film is formed over the entire surface of the silicon substrate 1, as shown in FIG. 5. A high dose of impurity ions of the same conductivity type as those in low impurity concentration regions 4, e.g. arsenic ions, is injected into the silicon substrate to form high impurity concentration regions 8. The dose of the injected impurities is about $1–5\times10^{15}$ (ions/cm$^2$) and a depth of the high impurity concentration regions before annealing is about 5–45 nm from the surface of the silicon substrate 1, thus the high impurity concentration regions 8 are formed deeper than the low impurity concentration regions 4. After that, the impurities are diffused into the silicon substrate 1 by heat treatment such as $N_2$ annealing, as described in forming the low impurity concentration regions 4.

Figure 6:
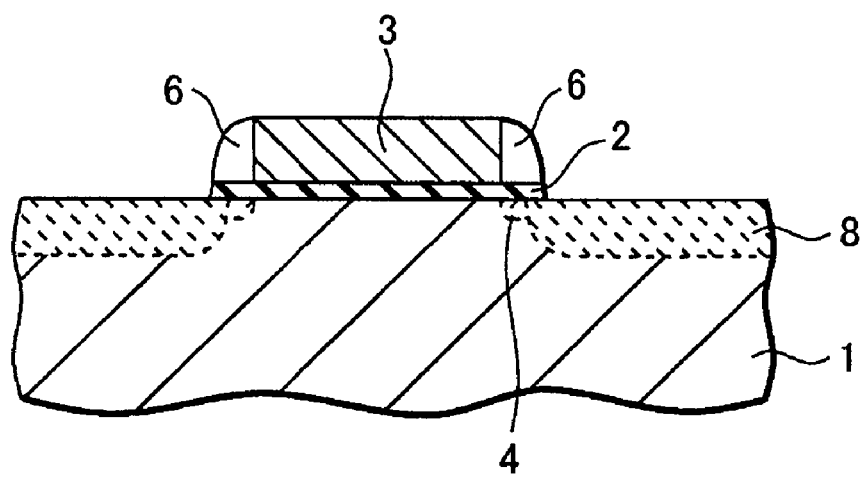
FIG. 6 is a cross-sectional view showing the manufacturing method of the semiconductor device according the embodiment of this invention.

The buffer film 7 is removed by wet-etching with a chemical solution primarily made of phosphoric acid, as shown in FIG. 6. The chemical solution may be made of phosphoric acid only, or phosphoric acid mixed with water or surface-active agent in order to adjust an etch rate or to improve surface wettability.

The silicon substrate 1 and the gate electrode 3 are scarcely removed in the wet-etching, since the chemical solution is primarily made of phosphoric acid. Also no carbon contamination is caused in the wet-etching, because the chemical solution contains no carbon.

Figure 7:
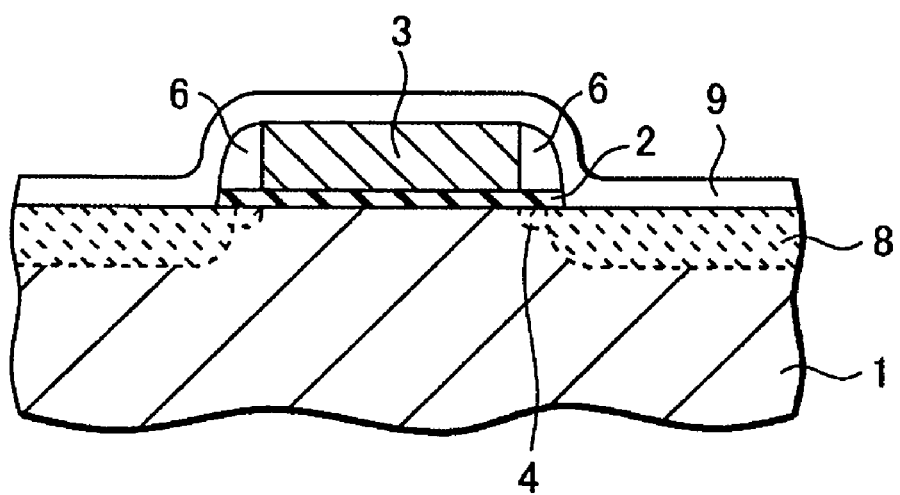
FIG. 7 is a cross-sectional view showing the manufacturing method of the semiconductor device according the embodiment of this invention.

A transition metal film 9 made of transition metal such as titanium, cobalt or nickel is formed over the entire surface of the silicon substrate 1, as shown in FIG. 7. Thickness of the film is about 30–40 nm for titanium and about 6–10 nm for cobalt.

The silicon substrate 1 is heated to a temperature at which the transition metal reacts with silicon, as shown in FIG. 8. The temperature is about 700° C. for titanium and about 500° C. for cobalt. A portion of the transition metal film 9 which has not reacted with silicon is removed by wet-etching using sulfuric acid or the like. Then the silicon substrate 1 is heated again to form silicide layers 10 in surface portions of the silicon substrate 1 and the gate electrode 3.

The rest of the manufacturing process to complete the semiconductor device including forming an interlayer insulation film, opening contact holes and forming metal wirings is well known in the art.

Figure 8A:
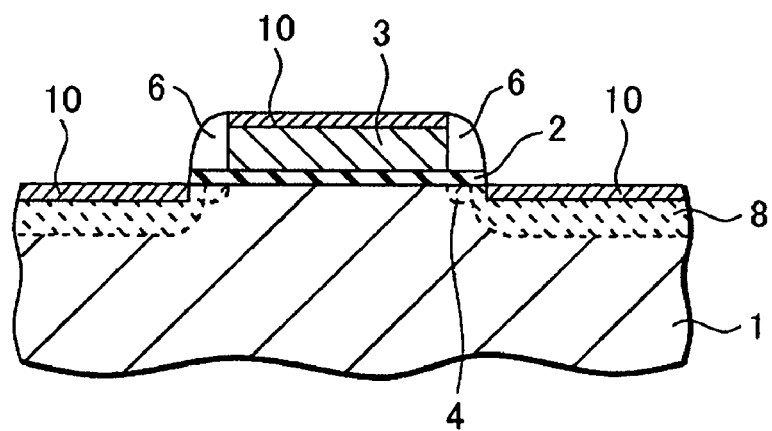
FIG. 8A is a cross-sectional view showing the manufacturing method of the semiconductor device according the embodiment of this invention.
Figure 8B:
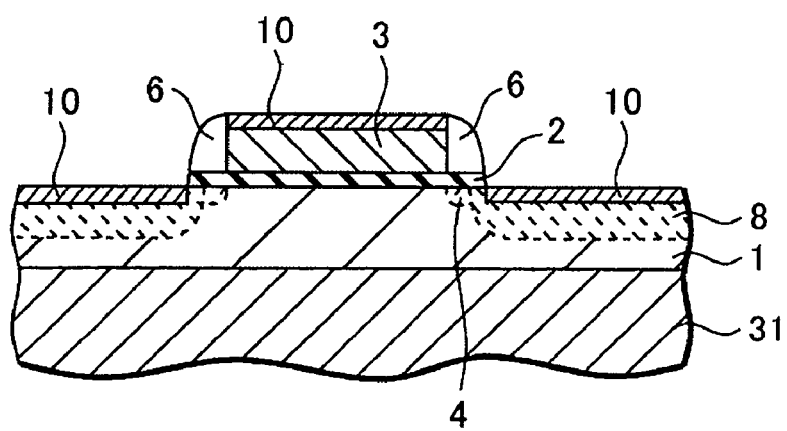
FIG. 8B is a cross-sectional view of a semiconductor device manufactured by the method of this embodiment modified to employ an insulator substrate.
Figure 9:
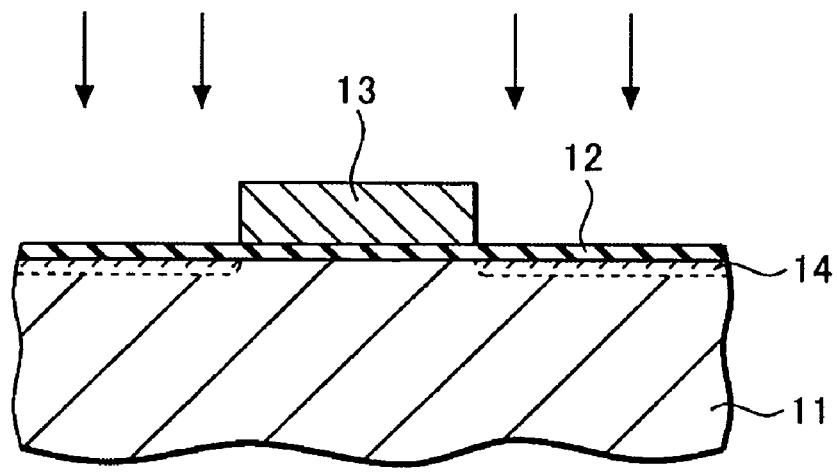
FIG. 9 is a cross-sectional view showing a manufacturing method of a semiconductor device according a prior art.
Figure 10:
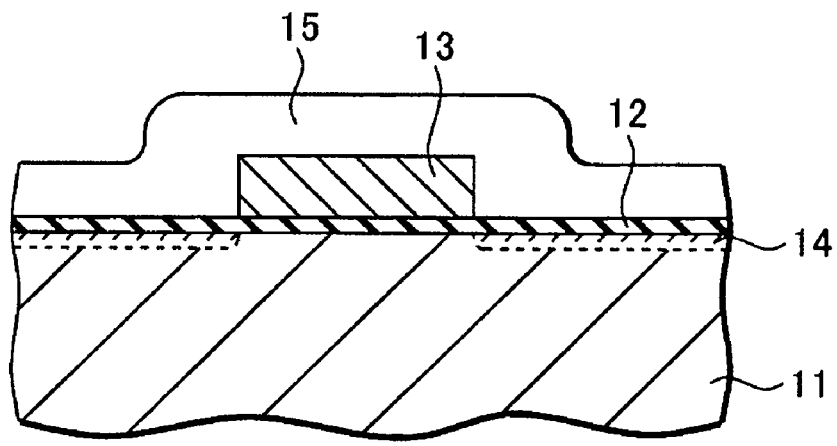
FIG. 10 is a cross-sectional view showing the manufacturing method of the semiconductor device according the prior art.
Figure 11:
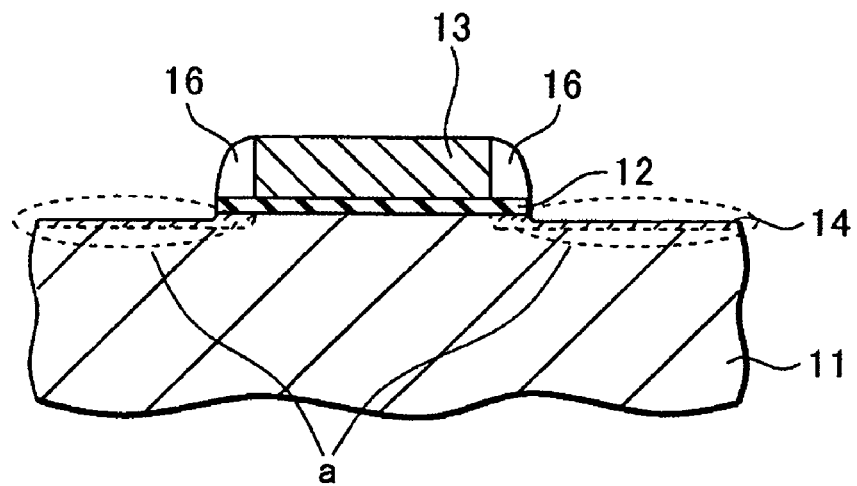
FIG. 11 is a cross-sectional view showing the manufacturing method of the semiconductor device according the prior art.
Figure 12:
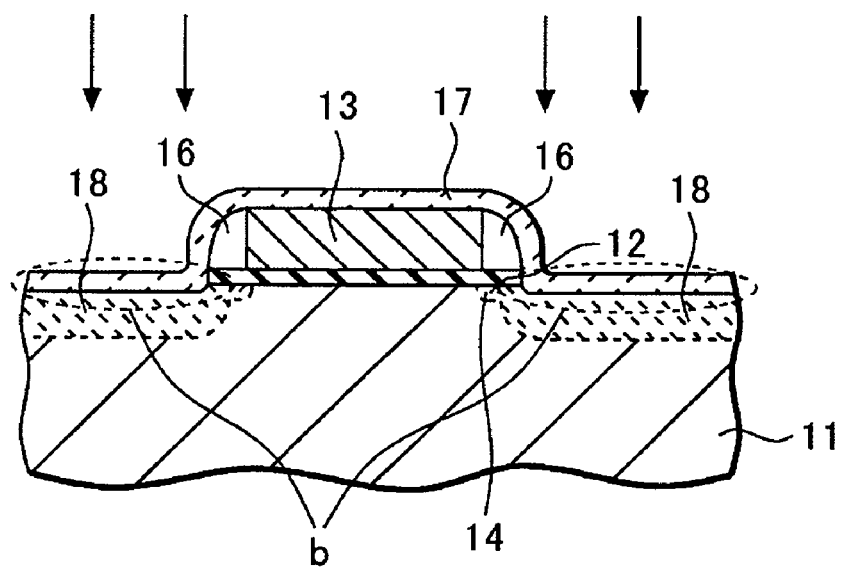
FIG. 12 is a cross-sectional view showing the manufacturing method of the semiconductor device according the prior art.
Figure 13:
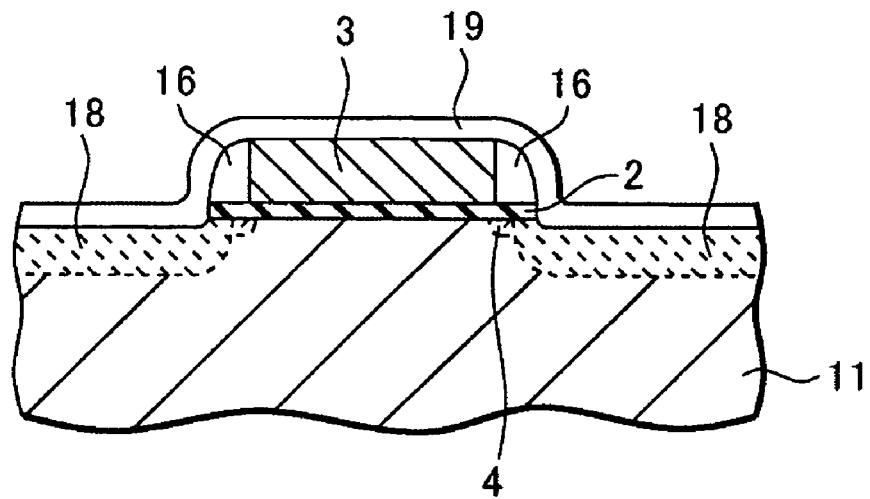
FIG. 13 is a cross-sectional view showing the manufacturing method of the semiconductor device according the prior art.
Figure 14:
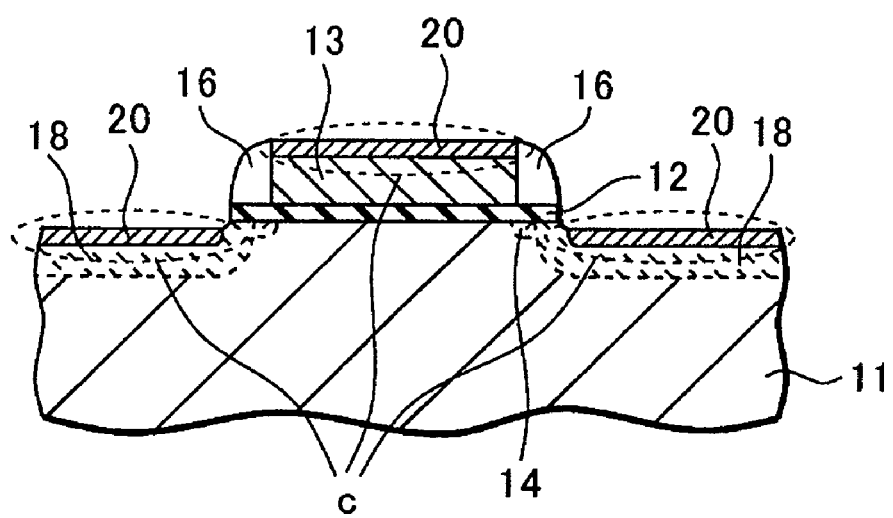
FIG. 14 is a cross-sectional view showing the manufacturing method of the semiconductor device according the prior art.
Figure 15:
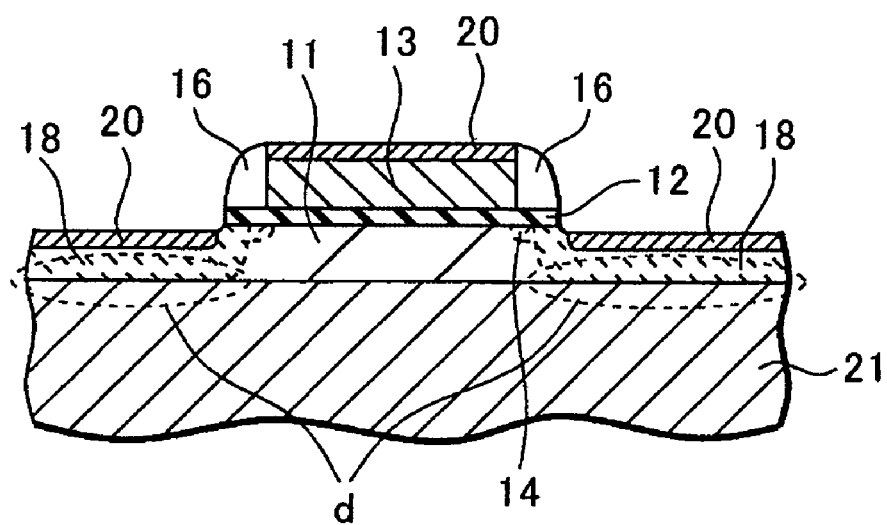
FIG. 15 is a cross-sectional view showing problems in the manufacturing method of the semiconductor device according the prior art.

FIG. 8B shows a semiconductor device manufactured by the method described above except that this method employs a substrate that includes an insulator 31 and a thin silicon layer 1 grown on the insulator 31. All the process steps shown FIGS. 1–8A are applicable to this substrate.

When an 8 nm thick cobalt film is used as the transition metal film 9 to form the silicide layers 10, for example, the thickness of the silicide layers 10 is about 32 nm. Therefore, for a substrate having an SOI structure with a silicon film of about 50 nm in thickness grown on an insulator, the conventional art, which reduces the thickness of the silicon substrate by about 30 nm, not only provides insufficient thickness of the silicide layers, but also eliminate most of the high and low impurity concentration regions. On the other hand, such problems do not occur in the manufacturing method according to the embodiment of this invention.

The reduction in the thickness of the silicon substrate and the carbon contamination due to dry-etching are prevented by forming the LDD structure and the silicide layers without dry-etching the silicon substrate. As a result, the low and high impurity concentration regions with enough thicknesses can be formed even in a thin silicon substrate such as the silicon layer in SOI structure. Also, transistors with more stable characteristics can be manufactured with high yield since large selection ratio is easily made available in wet-etching by choosing an appropriate chemical solution.

It should be noted that while N-type impurity ions such as phosphorus ions and arsenic ions are injected to form the low and high impurity concentration regions of N-type in the embodiment, P-type impurity ions such as boron ions are injected when low and high impurity concentration regions of P-type are to be formed.

What is claimed is:

1. A method of manufacturing a semiconductor device, comprising:
   forming a gate insulation film on a substrate, the substrate comprising a top surface portion made of silicon and the gate insulation film being disposed on the top surface portion;
   forming a gate electrode on the gate insulation film;
   forming a low impurity concentration region in the top surface portion adjacent the gate electrode;
   forming an insulation film to cover the gate insulation film and the gate electrode;
   dry-etching the insulation film so that the insulation film becomes thinner but still covers the gate insulation film and the gate electrode;
   removing by a first wet etching a portion of the insulation film that is on the gate electrode and another portion of the insulation film that is on a portion of the gate insulation film that is not covered by the gate electrode so as to form a spacer that is disposed on a side wall of the gate electrode;
   forming a silicon nitride film over an entire surface of the substrate having the gate electrode and the spacer thereon;
   forming a high impurity concentration region in the top surface portion adjacent the spacer so that the high impurity concentration region is deeper than the low impurity concentration region;
   removing by a second wet etching the silicon nitride film from the substrate in which the high and low impurity concentration regions are formed;
   forming a transition metal film over the substrate from which the silicon nitride film is removed; and
   inducing a chemical reaction between the transition metal layer and silicon so that a silicide layer is formed in the top surface portion of the substrate and another silicide layer is formed in a surface of the gate electrode.

2. The method of claim 1, wherein the substrate further comprises an insulator, and the top surface portion is disposed on the insulator.

3. The method of claim 1, wherein the gate insulation film comprises a thermally grown silicon oxide film.

4. The method of claim 1, wherein the insulation film comprises a silicon oxide.

5. The method of claim 4, wherein the silicon oxide is an oxide made from tetra-ethly-ortho silicate, a high temperature oxide or a non-doped silicate glass.

6. The method of claim 1, further comprising nitrogen annealing that is performed after the forming of the insulation film and before the first wet etching.

7. The method of claim 1, wherein the transition metal film comprises titanium, cobalt or nickel.

8. The method of claim 1, wherein the first wet etching uses a solution comprising hydrofluoric acid.

9. The method of claim 1, wherein the second wet etching uses a solution comprising phosphoric acid.

10. A method of manufacturing a semiconductor device, comprising:
    forming a gate insulation film on a substrate comprising a silicon layer grown on an insulator;
    forming a gate electrode on the gate insulation film, the gate electrode comprising a polysilicon film;

forming a low impurity concentration region of a first conductivity type in the silicon layer adjacent the gate electrode;

forming a silicon oxide film to cover the gate insulation film and the gate electrode;

dry-etching the silicon oxide film so that a thickness of the silicon oxide film becomes 5 to 35% of a thickness of the silicon oxide film at the time of the forming thereof;

removing by a wet etching using hydrofluoric acid a portion of the silicon oxide film that is on the gate electrode and another portion of the silicon oxide film that is on a portion of the gate insulation film that is not covered by the gate electrode so as to form a spacer that is disposed on a side wall of the gate electrode;

forming a silicon nitride film over an entire surface of the substrate having the gate electrode and the spacer thereon;

forming a high impurity concentration region of the first conductivity type in the silicon layer adjacent the spacer so that the high impurity concentration region is deeper than the low impurity concentration region;

removing by a wet etching using phosphoric acid the silicon nitride film from the substrate in which the high and low concentration regions are formed;

forming a transition metal film over the substrate from which the silicon nitride film is removed, the transition metal film comprising titanium, cobalt or nickel; and inducing a chemical reaction between the transition metal layer and silicon so that a silicide layer is formed in the silicon layer of the substrate and another silicide layer is formed in a surface of the gate electrode.

* * * * *